US009923551B2

(12) United States Patent
Rachmawati et al.

(10) Patent No.: US 9,923,551 B2
(45) Date of Patent: Mar. 20, 2018

(54) METHOD OF PERFORMING REAL TIME DECOMPOSITION OF A SIGNAL INTO COMPONENTS

(71) Applicant: ROLLS-ROYCE plc, London (GB)

(72) Inventors: Lily Rachmawati, Singapore (SG); Eng Yeow Cheu, Singapore (SG); Anna Swider, Ulsteinvik (NO); Martijn De Jongh, Aalesund (NO); Eivind Vinje, Aalesund (NO)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 15/292,323

(22) Filed: Oct. 13, 2016

(65) Prior Publication Data
US 2017/0111031 A1    Apr. 20, 2017

(30) Foreign Application Priority Data

Oct. 15, 2015  (GB) .................................. 1518240.5

(51) Int. Cl.
*H03H 21/00*   (2006.01)
*B63J 99/00*   (2009.01)

(52) U.S. Cl.
CPC ...... *H03H 21/0027* (2013.01); *H03H 21/002* (2013.01); *B63J 2099/006* (2013.01)

(58) Field of Classification Search
CPC ............. H03H 21/002; H03H 21/0025; H03H 21/0027; H03H 21/0043; H03H 21/0067;

(Continued)

(56) References Cited

U.S. PATENT DOCUMENTS

2004/0064311 A1* 4/2004 Sinha ................. G10L 19/0208
                                                      704/219
2004/0264601 A1* 12/2004 Demir .................... H03D 3/009
                                                      375/322

(Continued)

FOREIGN PATENT DOCUMENTS

EP    0 028 103 A1    5/1981
GB    2 165 654 A     4/1986

OTHER PUBLICATIONS

Mar. 9, 2017 Search Report issued in European Patent Application No. 16 19 3030.

(Continued)

*Primary Examiner* — Young T Tse
(74) *Attorney, Agent, or Firm* — Oliff PLC (57) ABSTRACT

The invention is a method that combines the following components: a high pass filter designed to have sufficiently small phase delay and roll-off value in transition band as well as sufficiently good attenuation; a distortion detection and reconstruction introduced by the application of the high pass filter by extraction the significant frequency components in relevant frequency band; a signal compensation that reshapes the output of the high pass filter by matching the filter's phase delay and attenuation characteristics so as to approximate low frequency component extraction that would be produced by an ideal filter (very sharp frequency transition and no delay); a time-domain detection and correction method that addresses special circumstances under which the compensation would be inaccurate to achieve real-time estimate in normal circumstances, and a time-domain correction method during and immediately after sudden changes in composite signal (spike) is detected.

6 Claims, 5 Drawing Sheets

(58) Field of Classification Search
CPC .... H03H 2021/0098; H04L 25/035057; H04L 25/03082; H04L 25/03146; H04L 25/03152; H04L 25/03159; H04L 25/03178; H04L 27/142; H04L 27/148; H04L 27/265; H04L 27/2652; H04L 27/389; B63J 2099/006
USPC ....... 375/240, 260, 316, 324, 340, 346, 350; 370/208, 210; 455/501, 63.1, 67.13, 455/67.16, 68, 71, 72, 337, 339; 708/400, 402–405
See application file for complete search history.

(56) References Cited

U.S. PATENT DOCUMENTS

2007/0081173 A1* 4/2007 Yanada .............. H04N 5/23212
358/1.6
2013/0142349 A1* 6/2013 Liu ...................... G10K 11/002
381/71.11

OTHER PUBLICATIONS

Tristan Perez et al., "Ship roll damping control," Annual Reviews in Control, Dec. 6, 2011, pp. 129-147. vol. 36, No. 1.
Chai, Wei et al., "Filter models for prediction of stochastic ship roll response," Probabilistic Engineering Mechanics, Jul. 1, 2015, pp. 104-114, vol. 41.
Fossen, Thor I., "Kalman filtering for Positioning and Heading Control of Ships and Offshore Rigs," Ieee Control Systems Magazine, Ieee Sewrvice Center, Dec. 1, 2009, pp. 32-46, vol. 29, No. 6, Piscataway, NJ.
Vaidyanathan, P. P., "The Theory of Linear Prediction," Synthesis Lectures on Signal Processing, Jan. 1, 2007, pp. 1-184, vol. 2, No. 1.
Feb. 23, 2016 Search Report issued in Great Britain Patent Application No. 1518240.5.
Rachmawati, Lily, "Incorporating Decision Maker Preference in Multi-Objective Evolutionary Algorithms," A Thesis Submitted for the Degree of Doctor of Philosophy, Department of Electrical Engineering, National University of Singapore. 2008. Singapore.

* cited by examiner

METHOD OF PERFORMING REAL TIME DECOMPOSITION OF A SIGNAL INTO COMPONENTS

FIELD OF THE DISCLOSURE

The present disclosure relates to a method of accurately decomposing a signal into components, each of which occupies a non-overlapping part of the frequency spectrum in real time. Such a method could be used, for example, to estimate the heeling angle of a marine body.

BACKGROUND TO THE DISCLOSURE

Conventional offshore marine vessels use a loading computer to provide crew with information about the stability and forces to which the vessel is expected to be exposed to as a result of a given loading condition and expected operational forces.

When these forces are critical for the safety of the vessel, the measurement of the vessel's response during a particular operation where these forces occur, together with a comparison against expected values, provides a real time assessment of the operation and can increase the level of operational safety.

These real-time operation assessment systems require a direct measurement of these responses with accuracy during an operation, is often difficult due to the motion of the vessel in seaways. However the motion registration of a vessel includes information on the response of the vessel to a certain force. For instance, a heel angle as a result of a transverse acting force can be deducted for the rolling motion of the vessel.

The rolling motion data for the vessel comprises contributions from wave, vessel load and operational forces, as well as measurement noise. These separate contributions correspond to different frequency bands that may overlap.

Typically, the vessel motion attributable to first order wave forces occupies the frequency band between 0.05 to 0.17 Hz, the vessel motion due to operational forces and loads on the vessel occupy the frequency band between 0 to 0.05 Hz, while measurement noise typically produces motion signal components in the higher frequencies.

The lowest frequency components of the vessel motion result in heeling,

In a conventional vessel motion prediction system, the isolation of different frequency components in a vessel motion signal is typically performed using frequency domain filters. This could be, for example, an Infinite Impulse Response filter (IIR) or a Finite Impulse Response (FIR) filter.

To obtain the vessel motion components of interest, (for example, motion due to operational forces) from the raw motion data, a low pass IIR or FIR could be applied.

The output from the IIR or FIR will contain the low frequency components with some distortion and time delay.

Figure 1:
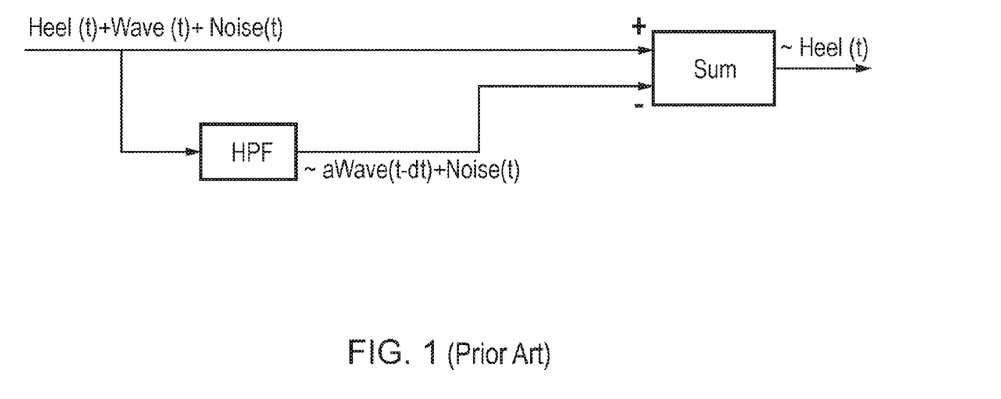
FIG. 1 shows a schematic arrangement of a high pass filter technique for estimating the heeling motion of a marine body, according to the prior art.

Alternatively, IIR and FIR high pass filters can also be utilized in the manner shown in FIG. 1. The low frequency component is obtained by subtracting the high frequency component at the output of the filter (HPF) from the original signal.

The output delay of low pass filters is too large to satisfy real time requirements of stability calculation. A typical IIR low pass filter has a minimum output delay of more than 2 seconds when attenuation of unwanted components is relaxed. This delay may be even larger when sufficient attenuation of unwanted components is required. FIR low pass filters can be designed with lower delay in the milliseconds range. However, it is well known that FIR low pass filters have very poor attenuation of unwanted components.

STATEMENTS OF DISCLOSURE

According to a first aspect of the present disclosure there is provided a method of decomposing a signal into components in frequency spectrum in real-time n, the method comprising the following steps:

(a) receiving a first signal representative of the composite signal (R), the first signal comprising at least of three frequency components H, W and N, two of which (H and W) are adjacent in the frequency domain;

(b) transmitting the first composite signal (R) to a high pass filter with a cut-off frequency designed to separate the lower frequency component, H, from the other components (W and N), the high pass filter producing a first intermediate signal ($S_1$) representative of a phase-delayed and amplitude-distorted W component ($\tilde{W}$) and the N component, simultaneously using a reference impulse signal (I) to find a second intermediate signal ($S_2$) representative of the phase-delay and amplitude-distortion characteristics of the same high pass filter;

(c) transmitting the first composite signal (R) to a reconstructing processor, the reconstructing processor detecting and reconstructing in time domain the W component that has been distorted by the application of the high pass filter in the relevant time window, to form a third intermediate signal ($S_3$);

(d) transmitting the second intermediate signal ($S_2$) and the third intermediate signal ($S_3$) to an adjustment processor, the adjustment processor computing from these the second intermediate signal ($S_2$) and the third intermediate signal ($S_3$), a fourth intermediate signal ($S_4$) representative of an estimated undistorted W component in the recent past, and computing a fifth intermediate signal ($S_5$) representative of a predicted W component at current time instance;

(e) transmitting the first composite signal (R), the first intermediate signal ($S_1$), the fourth intermediate signal ($S_4$), and the fifth intermediate signal ($S_5$) to an estimating module, the estimating module adding the fourth intermediate signal ($S_4$) to the first signal (R), and then subtracting each of the first intermediate signal ($S_1$) and the fifth intermediate signal ($S_5$), to produce a first estimation of the H frequency component ($\dot{H}$);

(f) refining the first estimation of the H frequency component ($\dot{H}$), obtained from steps (a) to (e), by taking into account the direction and magnitude of change from the past time steps to produce the final estimate of H, $\ddot{H}$; and (g) repeating steps (a) through (f) at a pre-determined time step frequency to obtain a stepwise series of values for the first estimation of the H frequency component ($\ddot{H}$).

The method of the disclosure provides for the decomposition of a signal into components in frequency spectrum with high precision and little distortion.

The reconstruction process extracts the significant frequency components in frequency band of the W component from the recent past observation of R to form the third intermediate signal $S_3$.

The adjustment of step (d) is performed according to the high pass filter characteristics in $S_2$ and the reconstructed significant frequency components in $S_3$.

The method may be applied to estimate the heeling angle of a vessel from a roll angle measurement sampled at 5 Hz. In this case the roll angle is the input signal r(t), which consists of the heel angle (h(t)) arising from vessel load and occupying the low frequency band (approx. 0 Hz to 0.05 Hz), motion contributed by wave (w(t)) occupying the next higher frequency band (approx. 0.05-0.17 Hz) and noise component (n(t)) occupying the higher frequency bands. The high pass filter is designed at a cut-off frequency slightly above 0.05 Hz such that the transition band of the filter contains only components of the wave. Wave signal components in the transition band will be imperfectly attenuated, i.e. non-uniformly delayed and scaled sinusoidal components of the wave will be present in the output of the high pass filter. At the same time, the detection and reconstruction block observes and extracts the wave components from a Fourier analysis of past observation of the input signal. These components are extrapolated in time to find the wave components in the recent past to the present, and knowledge of the high pass filter's characteristics is used to synthesize the distorted components in the transition band. The output of the high pass filter, containing delayed wave components and noise, can then be reshaped with the synthesized signal, such that only the heel remains. In parallel with the computation described above, an algorithm to detect the onset of a spike—which represents a sudden increase of operational load—checks if there is an unusually large and rapidly increasing vessel rolling motion. In the case that such a motion is detected, the roll angle overrides the compensated high pass filter output as such motion is significant to the stability of the vessel.

Time varying characteristics of the wave component, e.g. shifting frequency components, means that the prediction of current wave component from the past will be imperfect. These inaccuracies are mitigated by directional change adjustment, which ensures that the heel estimate only increases and decreases with the increase and decrease in the roll angle, and the envelope detection and correction, which ensures that the heel estimate remains within the bounds of the roll signal variation.

Realizable Digital Signal Processing filters have inevitable phase delay and gradual attenuation at the transition band. The phase delay and imperfect roll-off in the frequency domain correspond to time delay and distortion in the time domain. The method of the disclosure produces more precise signal separation based on frequency band and produces smaller delays (of less than 1 second for a 5 Hz input) in general real world data compared to existing methods.

This is achieved by compensating for the phase-delay and imperfect attenuation in realizable Digital Signal Processing filters by predicting in time-domain the signal components in the transition band and adjusting the prediction with the associated filter's magnitude response and phase delay at the specific frequency value. The prediction is obtained from a frequency domain decomposition of the recent past observation of the overall input signal. The filter's magnitude response and phase delay are obtained by probing the impulse response of the filter.

By this means, the method reshapes the output of the high pass filter, such that the combined steps approaches the behaviour of an ideal high pass filter with perfect roll-off and no phase delay.

The realizable high pass filter of the disclosure is designed to have zero magnitude response in the frequency band of interest to limit the reliance on time-domain prediction for signal components in the frequency band of interest. The high pass filter is also designed to have a phase delay in the transition band that allows reasonably accurate extrapolation in time of the constituent time-domain signal. The process of designing a digital signal processing filter for a desired set of characteristics is a well-established art that is outside of the scope of the disclosure.

A further feature of the method of the disclosure is its low computational cost (of less than 2 milliseconds per data sample), which is achieved by an efficient implementation.

Optionally, step (f) comprises the additional steps of:

(f1) calculating a first direction of change ($\Theta_1$) between the first estimated H frequency component ($\dot{H}$) at the current time step, and the final H estimate ($\ddot{H}$) at the previous time step;

(f2) refining $\dot{H}$ to produce a refined first estimated H frequency component ($\dot{H}$) that changes in the same direction as the composite signal (R), and is obtained by calculating a second direction of change ($\Theta_2$), between the composite signal (R) at the current time instance and the previous time instance; and (f3) replacing H with the estimated H ($\ddot{H}$) at the previous time step, if the first direction of change ($\Theta_1$) is opposite to a second direction of change ($\Theta_2$), to produce the refined estimate ($\dot{H}$) for the current time step.

Optionally, method step (f) comprises the additional step of:

(f4) refining $\dot{H}$ such that it lies within the envelope of the composite signal (R), by detecting if a difference between the estimated H at the current time step ($\dot{H}$) and the estimated H at the previous time step, is greater than a difference between the first signal at the current time step (R) and the first signal at the previous time step, and if so then the estimated H at the current time step ($\dot{H}$) is replaced with the estimated H at the previous time step to produce $\ddot{H}$ for the current time step.

Optionally, method step (f) comprises the additional step of:

(f1) obtaining $\dot{H}$ with the output of a spike and spike recovery module conditional on the application domain and the importance of retaining the raw signal during a spike (near instantaneous large increase of the raw signal).

Optionally, method step (f1) comprises the steps of:

(f1a) detecting the presence of a spike in the first composite signal (R);

(f2a) if the first composite signal (R) or retaining the instantaneous value of the first composite signal in that time instant to substitute for ($\dot{H}$); and (f3a) if not, checking if the current time instance is still within the recovery period from a previous spike, and if it is then applying a smoothing algorithm to the first composite signal (R) to obtain a substitute for $\dot{H}$.

Any sudden increase in the rolling motion of the vessel may result in a sudden peak or spike in the rolling motion data. Detection of such a spike is performed in the method of the disclosure by determining in real time if the vessel motion data contains a sudden and uncharacteristic increase in the rate of change of the roll signal.

As signal separation in frequency domain will inevitably dampen and delay the spike load, the method of the disclosure handles such sudden increases in rolling motion with a time-domain detection and recovery methodology that minimizes over and under estimation of heel angle during and after sudden changes to operational forces acting on the vessel.

When the onset of a spike is detected, the heel estimate is overridden to provide an instantaneous and un-dampened indication of the vessel motion, until the spike has died down. Without the spike detection and override, the output of any frequency domain filter (be it low pass filter or high pass) will produce a dampened motion indication with time delay. The time delay may mean the system does not recognize a sudden increase in operational forces that the ship is subjected to in time while damping downplays the magnitude of the spike.

The recovery algorithm overrides the heel estimate until the spike signature in the frequency spectra "remembered" by the high pass filter and wave prediction modules have passed. Without the recovery algorithm correction, the output of any frequency domain filter (be it a low pass version or a high pass version), will still indicate an uncharacteristically large rolling motion when none is present.

Depending on the specific context of the application of the method, different trade-off between signal delay and signal separation precision may be of interest. The characteristics of the disclosed method's performance may be adjusted by varying the smoothing algorithm parameters, the underlying gains in the high pass filter, and the time window of observation for the signal component prediction.

Other aspects of the disclosure provide methods and systems which include and/or implement some or all of the actions described herein. The illustrative aspects of the disclosure are designed to solve one or more of the problems herein described and/or one or more other problems not discussed.

BRIEF DESCRIPTION OF THE DRAWINGS

There now follows a description of an embodiment of the disclosure, by way of non-limiting example, with reference being made to the accompanying drawings in which.

The drawings are intended to depict only typical aspects of the disclosure, and therefore should not be considered as limiting the scope of the disclosure.

DETAILED DESCRIPTION

A time-varying signal contains multiple frequency components that become apparent when Fourier transform is applied to the signal. In various applications, it is of interest to obtain in time domain the component(s) of the signal that correspond to a specific frequency band. For example, in the dynamic stability and safety assessment of an anchor handler, it is important to obtain the low frequency component of the vessel rolling motion data. This component represents the heeling angle of the vessel.

Figure 2A:
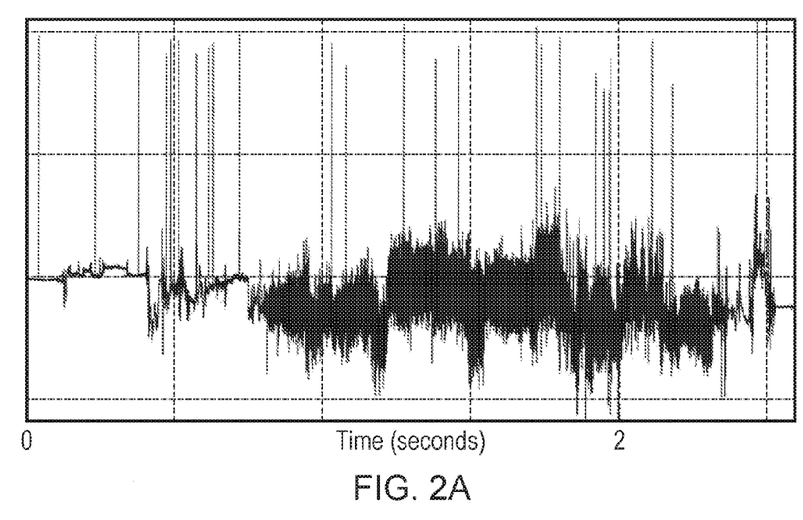
FIG. 2A shows an example time-domain signal r(t) sampled at 5 Hz.
Figure 2B:
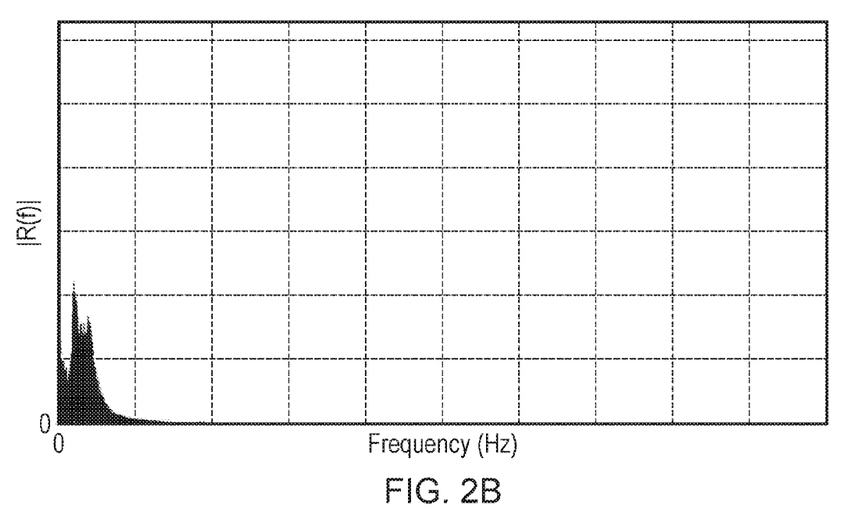
FIG. 2B shows the corresponding representation in frequency domain (magnitude) for the signal of FIG. 2A.
Figure 3:
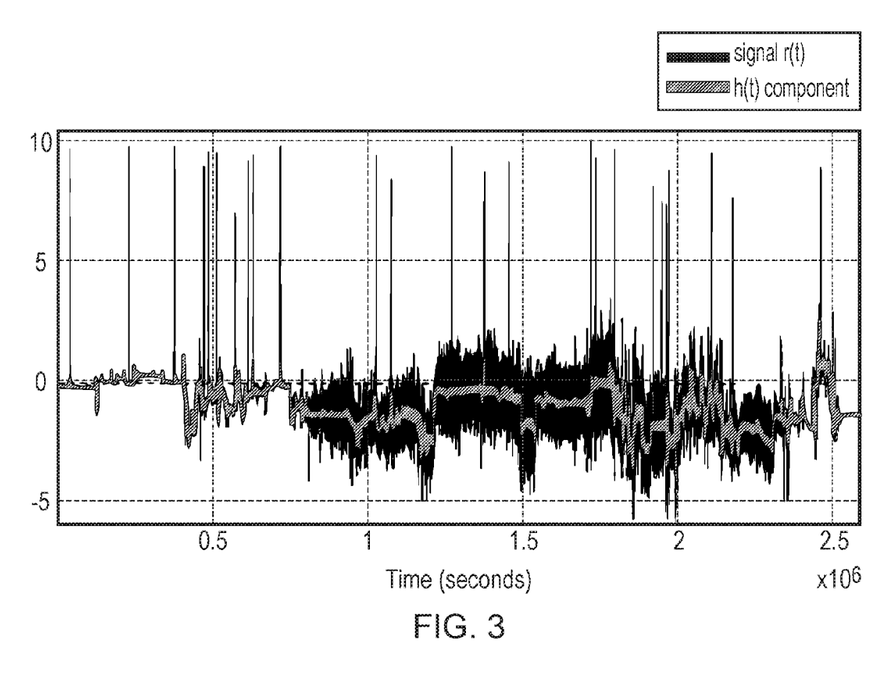
FIG. 3 shows the lower frequency component h(t) of the signal r(t), corresponding to frequency components of r(t)

The method of the disclosure decomposes in real time the time-varying streaming data into components that correspond to non-overlapping but closely spaced bands in the frequency spectrum with high precision and little time delay. Without loss of generality, the method is described here in the context of decomposing the signal r(t), which consists of low frequency components h(t) and w(t), and higher frequency component (n(t)) into h(t) and a combination of w(t) and n(t). The components h(t) and w(t) correspond to frequency components H(f) and W(f) in the frequency domain, and are closely spaced together. FIGS. 2A and 2B illustrates schematically the streaming data r(t) in time domain and its frequency domain representation R(f). FIG. 3 illustrates schematically the components in the streaming data to be separated using the method: h(t), w(t) and n(t).

Figure 5:
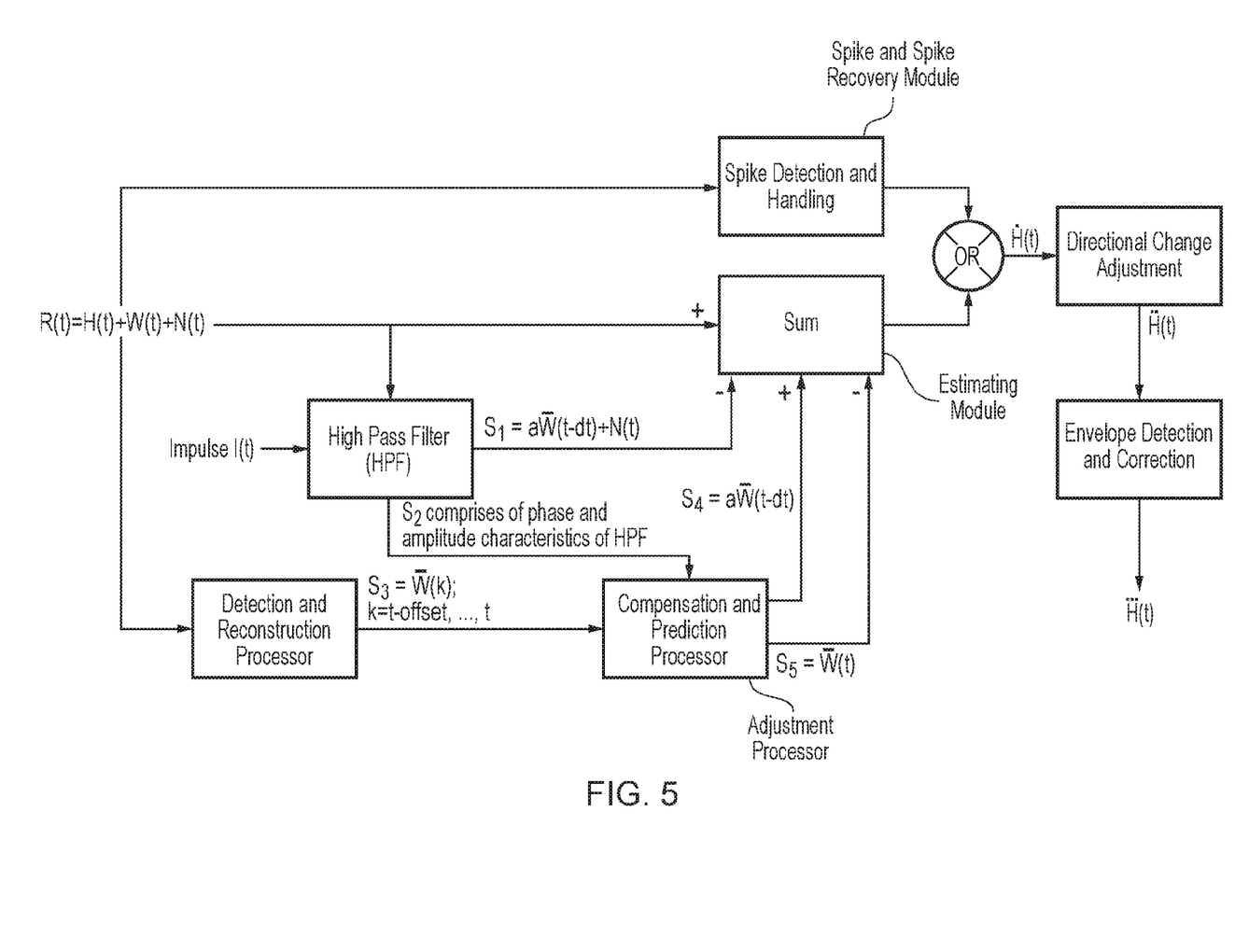
FIG. 5 shows a schematic arrangement of a method of estimating the heeling motion of a marine body according to an embodiment of the disclosure.

FIG. 5 illustrates schematically a method of separating the lowest frequency component h(t) from the other components in r(t). Signals are labelled in FIG. 5 according to the following convention: each signal S has a time-domain representation s(t) and a frequency-domain representation $S(f)$. For succinctness, the symbols in FIG. 5 encapsulate the time domain and/or the frequency domain representation of the signal. The input signal R, for instance, is r(t) when represented in time domain and R(f) when represented in the frequency domain. R(f) can be obtained from r(t) with a Fourier transform and r(t) can be obtained from R(f) with an inverse Fourier transform.

A first signal, comprising a stream of continuous time-varying data r(t) is collected by a sensor or other data acquisition method at the frequency of, for the sake of illustration, 1 Hz. In general, the sampling frequency of the signal r(t) need only be large enough to prevent aliasing effect, i.e. above the Nyquist frequency. The Fourier transform of the signal r(t), R(f), can be divided into three adjacent segments: H(f), W(f) and N(f) as shown in FIG. 3. The inverse Fourier transform of these segments in the frequency domain correspond to time-domain signals h(t), w(t), and n(t), which add up to form r(t) in time domain. The method is designed to separate one component, h(t), from the rest when none of the constituent signals, h(t), w(t) and n(t) or their frequency domain equivalents, can be measured or otherwise obtained through observation alone.

Figure 4A:
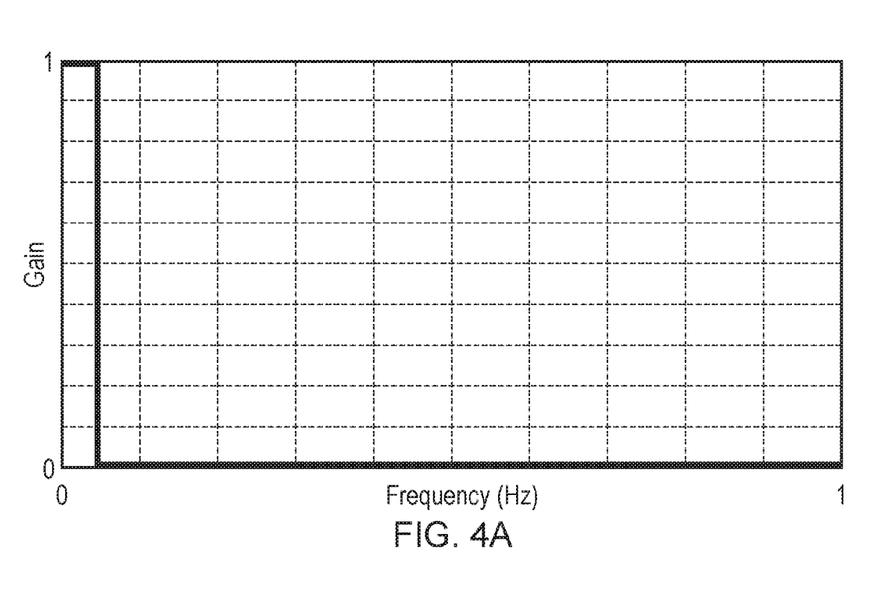
FIG. 4A shows the magnitude response of an ideal low pass filter in frequency domain.
Figure 4B:
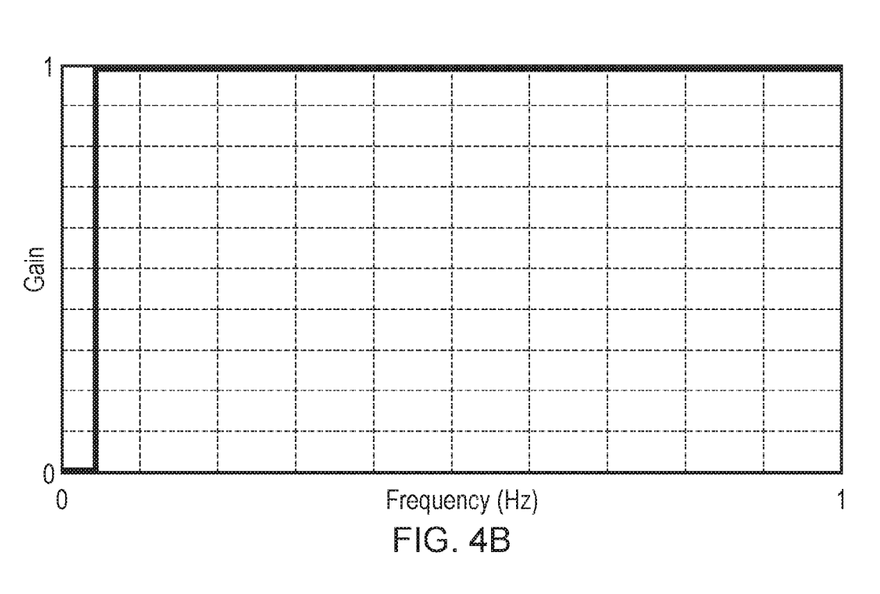
FIG. 4B shows the magnitude response of an ideal high pass filter in frequency domain.

The method, when applied to R decomposes the signal into H and the combination of W and N through the following steps. A high pass filter with a cut-off frequency between H(f) and W(f), $F_1$, such that at the upper boundary of H(f) the magnitude gain of the high pass filter is zero, is applied to the signal r(t). With an ideal high pass filter, all frequency components in R(f) that lie below the $F_1$ will be perfectly attenuated and all frequency components above $F_1$ will be passed through with unity magnitude gain and zero phase delay. This is represented by the frequency response shown in FIGS. 4A and 4B. Such a filter is not realizable. A realistic high pass filter has the inevitable imperfect roll-off and phase delay at the transition band. That is, depending on the type, order and parameters of the filter, the magnitude response will gradually increase from 0 to 1 in the transition band and the phase response will cause different frequency components in the transition band being delayed at different phase delays. The imperfect magnitude response and the phase response of the filter translate to signal distortion and time delay in the time domain.

As W(f) and H(f) are adjacent, this means that the output of the high pass filter, when applied to R, contains various frequency components within W(f) that are phase delayed and reduced in terms of magnitude. Let the output of the high pass filter when applied to R be the first intermediate signal $S_1$: $s_1(t)$ in time domain and $S_1(f)$ in frequency domain. The imperfect roll-off and phase response of the high pass filter means that $s_1(t)$ contains magnitude-distorted and time-delayed parts of w(t), i.e. it contains aw(t−dt). The higher frequency components, n(t) in time domain and N(f) in frequency domain, are passed through with no time delay or magnitude distortion as they are well beyond the transition band of the high pass filter.

The method described in FIG. 5 compensates for the distortion and phase delay introduced by the high pass filter. The extraction of the scaling factors a and the time delays dt is an important aspect in computing the compensation. These are properties of the high pass filter design, and can be identified from the impulse response of filter. To identify the scaling factors, a synthetic impulse signal i(t) is passed through the high pass filter to produce the second intermediate signal $S_2$: $s_2(t)$ in time domain and $S_2(f)$ in frequency domain. By observing the magnitudes of $S_2(f)$ at various values of frequency f we can extract a while observing the phase of $S_2(f)$ at various values of frequency f we can extract the phase delays—which can be easily converted into a time delay.

Another important aspect in computing the compensation is the constituents of the signal R within the recent past. This allows us to deduce what w(t−dt) is, when dt, the time delay, is known. This is obtained by transmitting the first composite signal R to a detection and reconstruction processor that generates a third intermediate signal $S_3$ representative of the constitutes of r(t) at some time in the past up to the current time. This is performed by computing the Fourier transform of recent samples of the composite signal, i.e. r(t) when t represents the current time up to offset seconds ago. For the sake of illustration, we can set offset to 60 seconds, to yield a Fourier transform of the past 300 samples of signal r(t). The value of offset determines, in time domain, how far in the past we look to reconstruct the distorted components and, in frequency domain, the resolution of the Fourier transform. This offset matches the length of the synthetic impulse signal i(t) to maximise the accuracy of the compensation.

In the detection and reconstruction processor significant components of the Fourier transform in the recent past observation are further identified, and artificial signals in time domain corresponding to these significant components are generated. These artificial signals are simply the sinusoids whose amplitudes and frequencies match the significant components, with zero phase. The collection of sinusoids can be arbitrarily extended in time to form predictions of the significant components of R but the further away from the current time, the worse the prediction will be. This collection of sinusoids is the third composite signal $S_3$: $S_3(t)$ in time domain and $S_3(f)$ in frequency domain.

In the compensation and prediction processor, the intermediate signals $S_3$ and $S_2$ are combined to estimate the magnitude distorted and time delayed components of W as well as predict the value of W at the current time step. These are respectively the fourth and fifth intermediate signals $S_4$ and $S_5$. The prediction is necessary because we do not know and cannot measure w(t) at the current time instant. The prediction is obtained by extending the third composite signal $S_3$ to the current time instant.

In the estimating module, the first intermediate signal $S_1$ is subtracted from the first composite signal R. The result is an estimate of H containing some components in W due to imperfect roll-off and phase response. The fourth intermediate signal $S_4$ is then added and the fifth intermediate signal $S_5$ subtracted to form a more accurate estimate of H: $\hat{H}$.

The accuracy of $\hat{H}$ depends on how well the compensation and prediction signals represent the actual values. If the characteristics do not change within the time window t-offset to t, then $\hat{H}$ can be 100% accurate, as demonstrated in our experiments with artificially generated test signals. If there is a change in frequency content in this time window, then the estimate produced by the compensation and prediction block will be inaccurate and in turn $\hat{H}$ will not be accurate.

The application for which this method was developed involves changes in the frequency content of the W component from time to time. To mitigate the inaccuracy introduced by such changes, two additional logics are added: the directional change adjustment and the envelope detection and correction. In the directional change adjustment, the method corrects for errors in the estimation of H that causes it to change in the opposite direction of the composite signal R. When the sign of the difference between $\hat{H}$ at the current time step and $\ddot{H}$ at the previous time step is opposite to that in R at the current and previous time steps, the estimate of H obtained by application of the overall method at the previous time step, i.e. $\ddot{H}$ at the previous time step, is substituted for the estimate at the current time step. Let the estimate of H corrected for directional change error be $\ddot{H}$.

An additional logic, the envelope detection and correction, ensures that the estimate of H stays within the envelope of signal R. The logic is based on a fundamental observation that the contribution of components within a frequency band to the overall signal cannot have larger energy than the overall signal. If $\ddot{H}$ is beyond the upper envelope of the signal R or below the lower envelope of R, then the $\ddot{H}$ at the previous time step is substituted.

When the wave spectrum remains relatively constant, the directional change correction and envelope detection and correction are effectively zero as the preliminary H estimate $\hat{H}$ will have satisfied the requirements underlying the correction logic.

The application for which this method was developed also requires that when there is a very large and sudden change in the magnitude of the first composite signal R that again quickly disappears, i.e. a spike in the first composite signal, the value of R instead of an estimate of its H component is produced. This is for safety reason and is an application specific feature. A spike detection logic is included, as a spike and spike recovery module, that detects based on the rate of change of the signal R in time whether a spike occurs.

After the spike has died down, it is again of interest in the application that an estimate of the H component is produced. With a high pass filter, however, the remnants of the spike will still be contained in $S_3$ and these time-delayed and magnitude distorted components cannot be reliably estimated by the reconstruction processor as by definition the spike occurred very quickly and is an anomaly. This leads to inaccurate $S_4$. Further, the prediction of significant components at the current time steps cannot be reliably done when there is a spike in the recent past, leading to inaccurate $S_5$. To mitigate this effect, instead of an estimate of H produced by the high pass filter, reconstruction and compensation and prediction, immediately after a spike has died down, a smoothed version of R is substituted by means of an 'OR' circuit. The smoothing is performed by a low pass filter, the moving average filter. If instead of H the application requires that components in higher frequency bands are to be obtained, the smoothing can be replaced by a band pass filter or a high pass filter. This substitution occurs for offset timesteps after the spike is detected to have died down by examining the rate of change of R. After offset timesteps have passed, sufficient observation of the signal R has been collected such that $S_4$ and $S_5$ can be reliably accurately computed again.

Various parameters of the algorithm, such as the coefficients of the high pass filter, the window of observation for filter output compensation and adjustment calculation, the cut-off frequency at which compensation and adjustment are calculated, and window of observation for signal envelope definition and moving average correction, can be adjusted to obtain different trade-off between final attenuation and output delay.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person of skill in the art are included within the scope of the disclosure as defined by the accompanying claims.

The invention claimed is:

1. A method of decomposing a signal into components in frequency spectrum in real-time, the method comprising the following steps:
   (a) receiving a first signal representative of a first composite signal (R), the first signal comprising at least of three frequency components (H, W and N), two of the frequency components (H and W) are adjacent in frequency domain;
   (b) transmitting the first composite signal (R) to a high pass filter with a cut-off frequency designed to separate the frequency component (H) from the other components (W and N), the high pass filter producing a first intermediate signal ($S_1$) representative of a phase-delayed and amplitude-distorted component ($\dot{W}$) of the frequency component (W) and the frequency component (N), simultaneously using a reference impulse signal (I) to generate a second intermediate signal ($S_2$) representative of phase-delay and amplitude-distortion characteristics of the same high pass filter;
   (c) transmitting the first composite signal (R) to a reconstructing processor, the reconstructing processor detecting and reconstructing in time domain the phase-delayed and amplitude-distorted component ($\dot{W}$) that has been distorted by the application of the high pass filter in a relevant time window, to form a third intermediate signal ($S_3$);
   (d) transmitting the second intermediate signal ($S_2$) and the third intermediate signal ($S_3$) to a compensation and prediction processor, the compensation and prediction processor computing the second intermediate signal ($S_2$) and the third intermediate signal ($S_3$), to generate a fourth intermediate signal ($S_4$) representative of an estimated undistorted component in a recent past, and generate a fifth intermediate signal ($S_5$) representative of a predicted component at current time instance;
   (e) transmitting the first composite signal (R), the first intermediate signal ($S_1$), the fourth intermediate signal ($S_4$), and the fifth intermediate signal ($S_5$) to an estimating module, implemented by a processor, the estimating module adding the fourth intermediate signal ($S_4$) to the first composite signal (R), and then subtracting each of the first intermediate signal ($S_1$) and the fifth intermediate signal ($S_5$), to produce a first estimation ($\dot{H}$) of the frequency component (H);
   (f) refining the first estimation ($\dot{H}$) of the frequency component (H), obtained from steps (a) to (e), by taking into account the direction and magnitude of change from a previous time step to produce a final estimation ($\ddot{H}$) of the frequency component (H); and
   (g) repeating steps (a) through (f) at a pre-determined time step to obtain a stepwise series of values for the first estimation ($\dot{H}$) of the frequency component (H).

2. The method as claimed in claim 1, wherein step (f) comprises the additional step of:
   (f1) refining a second estimation ($\ddot{H}$) of the frequency component (H) such that it lies within an envelope of the first composite signal (R), by detecting if a difference between the second estimation ($\ddot{H}$) of the frequency component (H) at a current time step and an estimated frequency component of the frequency component (H) at the previous time step, is greater than a difference between the first signal at the current time step and the first signal at the previous time step, and if so then the estimated frequency component of the frequency component (H) at the current time step is replaced with the estimated frequency component of the frequency component (H) at the previous time step to produce the final estimation ($\ddot{H}$) of the frequency component (H) for the current time step.

3. The method as claimed in claim 1, wherein step (f) comprises the additional steps of:
   (f1) calculating a first direction of change ($\Theta_1$) between the first estimation ($\dot{H}$) of the frequency component (H) at a current time step and the final estimation ($\ddot{H}$) of the frequency component (H) at the previous time step;
   (f2) refining the first estimation ($\dot{H}$) of the frequency component (H) to produce a second estimation ($\dot{H}$) of the frequency component (H) that changes in the same direction as the first composite signal (R), and calculating a second direction of change ($\Theta_2$), between the first composite signal (R) at the current time instance and a previous time instance; and
   (f3) replacing the first estimation ($\dot{H}$) of the frequency component (H) with the final estimation ($\ddot{H}$) of the frequency component (H) at the previous time step, if the first direction of change ($\Theta_1$) is opposite to the second direction of change ($\Theta_2$), to produce the second estimation ($\dot{H}$) of the frequency component (H) for the current time step.

4. The method as claimed in claim 3, wherein step (f) further comprises the additional step of:
   (f4) refining the second estimation ($\dot{H}$) of the frequency component (H) such that it lies within an envelope of the first composite signal (R), by detecting if a difference between the refined second estimation ($\dot{H}$) of the frequency component (H) at the current time step and an estimated frequency component of the frequency component (H) at the previous time step, is greater than a difference between the first signal at the current time step and the first signal at the previous time step, and if so then the estimated frequency component of the frequency component (H) at the current time step is replaced with the estimated frequency component of the frequency component (H) at the previous time step to produce the final estimation ($\ddot{H}$) of the frequency component (H) for the current time step.

5. The method as claimed in claim 3, wherein step (f) further comprises the additional step of:
   (f4) obtaining the second estimation ($\dot{H}$) of the frequency component (H) with an output of a spike and spike recovery module, implemented by the processor, conditional on an application domain and retaining a raw signal during a spike near instantaneous large increase of the raw signal.

6. The method as claimed in claim 5, wherein step (f4) comprises the steps of:
   (f4a) detecting the presence of a spike in the first composite signal (R);
   (f4b) if the detected signal is present, retaining the instantaneous value of the first composite signal (R) in that time instant to substitute for the first estimation ($\dot{H}$) of the frequency component (H); and
   (f4c) if not, checking if the current time instance is still within a recovery period from a previous spike, and if it is then applying a smoothing algorithm to the first composite signal (R) to obtain a substitute for the first estimation ($\dot{H}$) of the frequency component (H).

* * * * *